United States Patent
Thompson et al.

(10) Patent No.: US 12,000,894 B2
(45) Date of Patent: Jun. 4, 2024

(54) SYSTEMS AND METHODS FOR MANAGING USE OF PORTABLE IHS BATTERIES

(71) Applicant: Dell Products, L.P., Round Rock, TX (US)

(72) Inventors: Richard C. Thompson, Cedar Park, TX (US); Vivek Viswanathan Iyer, Austin, TX (US); Nikhil Manohar Vichare, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 43 days.

(21) Appl. No.: 17/177,383

(22) Filed: Feb. 17, 2021

(65) Prior Publication Data

US 2022/0260639 A1 Aug. 18, 2022

(51) Int. Cl.
| | |
|---|---|
| *G01R 31/367* | (2019.01) |
| *G01R 31/382* | (2019.01) |
| *G06F 1/16* | (2006.01) |
| *G06F 1/26* | (2006.01) |
| *G06F 1/3203* | (2019.01) |
| *G06F 1/3212* | (2019.01) |
| *G06F 1/3228* | (2019.01) |
| *G06F 11/30* | (2006.01) |

(52) U.S. Cl.
CPC ......... *G01R 31/367* (2019.01); *G01R 31/382* (2019.01); *G06F 1/1635* (2013.01); *G06F 1/3203* (2013.01); *G06F 1/3212* (2013.01); *G06F 11/3062* (2013.01)

(58) Field of Classification Search
CPC .. G01R 31/382; G06F 1/3203; G06F 11/3062
See application file for complete search history.

(56) References Cited

U.S. PATENT DOCUMENTS

| | | | |
|---|---|---|---|
| 2006/0005057 A1* | 1/2006 | Nalawadi | G06F 1/3287 713/320 |
| 2007/0004467 A1* | 1/2007 | Chary | H04W 52/0277 455/572 |
| 2007/0198863 A1* | 8/2007 | Bose | G06F 1/206 713/300 |
| 2012/0047379 A1* | 2/2012 | Chen | G06F 1/26 713/320 |

(Continued)

*Primary Examiner* — Jaweed A Abbaszadeh
*Assistant Examiner* — Gayathri Sampath
(74) *Attorney, Agent, or Firm* — Fogarty LLP

(57) ABSTRACT

Systems and methods manage use of rechargeable battery power of Information Handling Systems (IHSs). In managing power draws from the batteries of an IHS, use of software applications of the IHS is monitored and use is detected of a software application that has been designated as prioritized for use of the IHS batteries. A power throttling factor is selected for use in drawing power from the rechargeable batteries of the IHS while the prioritized software application remains in use. The selected power throttling factor is transmitted to an embedded controller of the IHS and the embedded controller is notified when the prioritized software application is no longer in use by a user of the IHS. The embedded controller receives the power throttling factor and, while the prioritized software application remains in use, the embedded controller limits power drawn from the IHS rechargeable batteries according to the power throttling factor.

20 Claims, 5 Drawing Sheets

(56) References Cited

U.S. PATENT DOCUMENTS

| | | | |
|---|---|---|---|
| 2012/0239949 A1* | 9/2012 | Kalyanasundaram | ........................ G06F 1/3212 713/320 |
| 2013/0196720 A1* | 8/2013 | Sivaraman | .............. G06F 1/263 340/384.1 |
| 2014/0082383 A1* | 3/2014 | De Cesare | ............ G06F 1/3206 713/320 |
| 2015/0289209 A1* | 10/2015 | Fishman | ........... H04W 52/0261 370/311 |
| 2016/0150072 A1* | 5/2016 | Rangarajan | ....... H04W 52/0254 455/574 |
| 2016/0366648 A1* | 12/2016 | Bostick | ............. H04W 52/0258 |
| 2018/0095509 A1* | 4/2018 | Abozaed | ................ G06F 9/4893 |
| 2019/0041971 A1* | 2/2019 | Ananthakrishnan | ...... G06F 1/28 |
| 2019/0305383 A1* | 10/2019 | Muntes | ................ H01M 10/425 |
| 2020/0183467 A1* | 6/2020 | Anantharangachar | ........................ G06F 9/5094 |

* cited by examiner

SYSTEMS AND METHODS FOR MANAGING USE OF PORTABLE IHS BATTERIES

FIELD

This disclosure relates generally to Information Handling Systems (IHSs), and more specifically, to powering portable IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Certain IHSs, such as laptops, tablets and mobile phones, are portable and are designed to operate using DC power supplied by rechargeable batteries. These batteries of portable IHSs are commonly recharged using an AC adapter that is plugged into an AC outlet and provides a portable IHS with a regulated supply of DC power. In some instances, in additional to providing power that is used to recharge the batteries of a portable IHS, the DC power supplied to an IHS by an AC adapter may also be used to directly power the operations of the IHS. In some instances, a portable IHS may draw power directly from the DC supply provided by an AC adapter and may also draw additional power from the rechargeable batteries. Such capabilities allow a portable IHS to utilize power levels, that may be referred to as turbo modes, that are greater than power levels than can be supplied individually by an AC adapter or by rechargeable batteries, thus supporting higher performance capabilities of the portable IHS. When the portable IHS is not coupled to an AC adapter, additional turbo modes may support drawing power at high rates from the rechargeable batteries of the IHS. Such turbo modes may advantageously support increased performance for portable IHSs, but such turbo modes also quickly draw down the charge level of the batteries. Accordingly, the use of turbo modes by a portable IHS may result in low battery charge levels that significantly limit portable use of the IHS. In addition, the performance of the IHS may also be compromised by operating modes that limit the performance capabilities of the IHS when battery charge levels are below certain thresholds.

SUMMARY

In various embodiments, Information Handling Systems (IHSs) may include: one or more rechargeable batteries; one or more processors; a memory device coupled to the one or more processors, the memory device storing computer-readable instructions that, upon execution by the one or more processors, cause execution of an operating system of the IHS, wherein the operating system is configured to: monitor software applications in use by a user of the IHS; detect use of a first software application by the user, wherein the first software application has been designated as an application that is prioritized for use of the rechargeable batteries of the IHS; select a power throttling factor for use in drawing power from the rechargeable batteries of the IHS while the first software application is in use; transmit the selected power throttling factor to an embedded controller of the IHS; notify the embedded controller when the first software application is no longer in use by the user of the IHS; and the embedded controller comprising a memory having program instructions stored thereon that, upon execution by a logic unit of the embedded controller, cause the embedded controller to: receive the selected power throttling factor; and limit power drawn from the rechargeable batteries of the IHS according to the power throttling factor while the first software application remains in use.

In some additional IHS embodiments, the prioritized applications are selected by the user of the IHS, and wherein the prioritized applications selected by the user are modified based on a machine learning model. In some additional IHS embodiments, the power throttling factor is selected for the first software application based on a ranking of the first software application within the prioritized applications. In some additional IHS embodiments, the power throttling factor is selected based on an event scheduled by the user. In some additional IHS embodiments, the power throttling factor is selected based on a location of the scheduled event. In some additional IHS embodiments, the embedded controller is notified the first software application is no longer in use in response to an inability to detect the user in proximity to the IHS. In some additional IHS embodiments, the embedded controller is notified the first software application is no longer in use in response to detecting a user interface of the first software application is not visible to the user via a display of the IHS. In some additional IHS embodiments, the power throttling factor is selected based on prior observations of peak power use when the first software application was previously in use.

In various additional embodiments, methods are provided for powering an Information Handling System (IHS). The methods include: monitoring software applications in use by a user of the IHS, wherein the monitored software applications comprise processes running within an operating system of the IHS; based on the monitoring, detecting use of a first software application of the operating system by the user, wherein the first software application has been designated as an application that is prioritized for use of power stored in one or more rechargeable batteries of the IHS; selecting a power throttling factor for use in limiting power that is drawn from the rechargeable batteries of the IHS while the first software application is in use by the user of the IHS; transmitting the selected power throttling factor to an embedded controller of the IHS; notifying the embedded controller when the first software application is no longer in use by the user of the IHS; receiving, by the embedded controller of the IHS, the selected power throttling factor; and limiting, by the embedded controller, power drawn from the rechargeable batteries of the IHS according to the power throttling factor while the first software application remains in use.

In some additional method embodiments, the prioritized applications are selected by the user of the IHS, and wherein the prioritized applications selected by the user are modified based on a machine learning model that is trained based on monitored power demands during prior use of the first software application by the user. In some additional method embodiments, the power throttling factor is selected for the first software application based on a ranking of the first software application within the prioritized applications. In some additional method embodiments, the power throttling factor is selected based on an event scheduled by the user. In some additional method embodiments, the power throttling factor is selected based on a location of the scheduled event. In some additional method embodiments, the embedded controller is notified the first software application is no longer in use in response to an inability to detect the user in proximity to the IHS. In some additional method embodiments, the embedded controller is notified the first software application is no longer in use in response to detecting a user interface of the first software application is not visible to the user via a display of the IHS. In some additional method embodiments, the power throttling factor is selected based on prior observations of peak power use when the first software application was previously in use.

In various embodiments, computer-readable storage devices include instructions stored thereon for powering an Information Handling System (IHS), wherein execution of the instructions by one or more processors of the IHS causes the one or more processors to: monitor software applications in use by a user of the IHS, wherein the monitored software applications comprise processes running within an operating system of the IHS; based on the monitoring, detect use of a first software application of the operating system by the user, wherein the first software application has been designated as an application that is prioritized for use of power stored in one or more rechargeable batteries of the IHS; select a power throttling factor for use in limiting power that is drawn from the rechargeable batteries of the IHS while the first software application is in use by the user of the IHS; transmit the selected power throttling factor to an embedded controller of the IHS; notify the embedded controller when the first software application is no longer in use by the user of the IHS; receive, by the embedded controller of the IHS, the selected power throttling factor; and limit, by the embedded controller, power drawn from the rechargeable batteries of the IHS according to the power throttling factor while the first software application remains in use.

In some additional storage device embodiments, the power throttling factor is selected based on an event scheduled by the user. In some additional storage device embodiments, the embedded controller is notified the first software application is no longer in use in response to an inability to detect the user in proximity to the IHS. In some additional storage device embodiments, the embedded controller is notified the first software application is no longer in use in response to detecting a user interface of the first software application is not visible to the user via a display of the IHS.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory.

Figure 1:
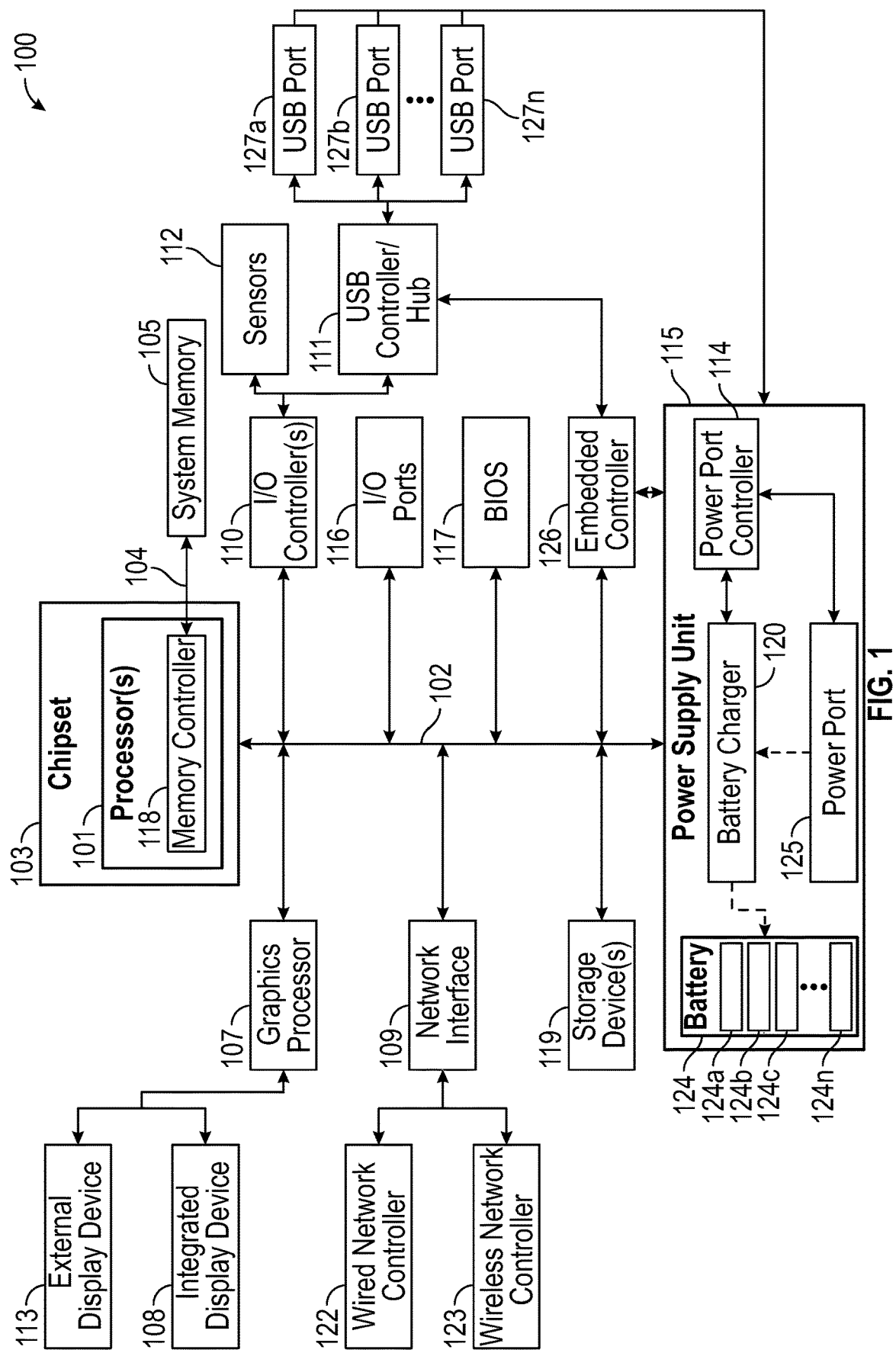
FIG. 1 is a block diagram depicting certain components of an IHS operable according to various embodiments for managing the use of available modes for drawing power from the rechargeable batteries of the IHS.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. FIG. 1 shows an example of an IHS configured to implement the systems and methods described herein according to certain embodiments. It should be appreciated that although certain IHS embodiments described herein may be discussed in the context of a personal computing device, other embodiments may be utilized.

As described, certain portable IHSs may utilize AC adapters for providing power from an electrical outlet, where the AC power from the outlet is converted to a DC power supply that is used in powering a portable IHS and/or in recharging internal batteries of the portable IHS. As described with regard to FIG. 1, certain portable IHSs such as laptops may include multi-core processors, a separate graphics processor, significant amounts of memory, persistent storage drives, specialized microcontrollers and one or more integrated displays. Such high performance portable IHSs may have significant peak power demands, in some cases greater than 200 watts.

In some instances, portable IHSs may have peak power demands as high as 250 watts. In some instances, an IHS may support various battery modes that support peak power demands through rapid battery discharges that are capable of supplying high levels of power, but that can quickly deplete the charge level of the battery. In some instances, such battery modes may be available for use when the IHS is operating solely on battery power and may also be available when the IHS is coupled to an AC power source via an AC adapter. When such battery modes are available while an IHS is coupled to an AC adapter, these high-performance battery modes may be used to support peak power demands that could not be supported separately by the AC adapter or by the battery. These turbo modes thus support high-performance computing tasks that have high peak power demands, but these power modes also rapidly deplete the available battery charge, even when the IHS is coupled to an AC power source. Even with restrictions on use of such high-performance battery modes, a portable IHS that is operating using strictly battery power will significantly reduce the available runtime that can be supported by the battery. Although the battery charge is depleted at a slower rate when an IHS is coupled to an AC adapter, the charge level of the battery many nonetheless be significantly lowered, thus significantly reducing the runtime that can be supported if the user needs to unplug from the AC power source.

FIG. 1 is a block diagram depicting certain components of an IHS 100 operable according to various embodiments for managing the use of available modes for drawing power from the rechargeable batteries 124 of the IHS. As described in additional detail below, IHS 100 may include various battery modes that may be used to support peak power demands for short durations. Such battery modes allow the IHS to support high-performance computing tasks, but may result in rapid discharge of available battery power. Embodiments provide capabilities for selectively utilizing such battery modes in a manner that preserves the charge of batteries 124 by reserving use of high-performance battery modes for the operation of prioritized software applications of the IHS. Embodiments may also limit the use of available battery capacity based on various other conditions, such as upcoming periods of expected battery use, location changes and a user's confirmed presence in proximity to the IHS. In various embodiments, IHS 100 may include an embedded controller 126 that includes logic that executes program instructions, in conjunction with operations by components of power supply unit 115 and the operating system of IHS 100, to perform the operations disclosed herein for managing the use of available modes for drawing power from the rechargeable batteries 124 of the IHS. While a single IHS 100 is illustrated in FIG. 1, IHS 100 may be a component of an enterprise system that may include any number of additional IHSs that may also be configured in the same or similar manner to IHS 100.

IHS 100 includes one or more processors 101, such as a Central Processing Unit (CPU), that execute code retrieved from a system memory 105. Although IHS 100 is illustrated with a single processor 101, other embodiments may include two or more processors, that may each be configured identically, or to provide specialized processing functions. Processor 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

In the embodiment of FIG. 1, the processor 101 includes an integrated memory controller 118 that may be implemented directly within the circuitry of the processor 101, or the memory controller 118 may be a separate integrated circuit that is located on the same die as the processor 101. The memory controller 118 may be configured to manage the transfer of data to and from the system memory 105 of the IHS 100 via a high-speed memory interface 104. The system memory 105 that is coupled to processor 101 provides the processor 101 with a high-speed memory that may be used in the execution of computer program instructions by the processor 101. Accordingly, system memory 105 may include memory components, such as such as static RAM (SRAM), dynamic RAM (DRAM), NAND Flash memory, suitable for supporting high-speed memory operations by the processor 101. In certain embodiments, system memory 105 may combine both persistent, non-volatile memory and volatile memory. In certain embodiments, the system memory 105 may be comprised of multiple removable memory modules.

IHS 100 utilizes a chipset 103 that may include one or more integrated circuits that are connect to processor 101. In the embodiment of FIG. 1, processor 101 is depicted as a component of chipset 103. In other embodiments, all of chipset 103, or portions of chipset 103 may be implemented directly within the integrated circuitry of the processor 101. Chipset 103 provides the processor(s) 101 with access to a variety of resources accessible via bus 102. In IHS 100, bus 102 is illustrated as a single element. Various embodiments may utilize any number of buses to provide the illustrated pathways served by bus 102.

As illustrated, a variety of resources may be coupled to the processor(s) 101 of the IHS 100 through the chipset 103. For instance, chipset 103 may be coupled to a network interface 109 that may support different types of network connectivity. In certain embodiments, IHS 100 may include one or more Network Interface Controllers (NICs), each of which may implement the hardware required for communicating via a specific networking technology, such as VVi-Fi, BLUETOOTH, Ethernet and mobile cellular networks (e.g., CDMA, TDMA, LTE). As illustrated, network interface 109 may support network connections by wired network controllers 122 and wireless network controller 123. Each network controller 122, 123 may be coupled via various buses to the chipset 103 of IHS 100 in supporting different types of network connectivity, such as the network connectivity utilized by applications of the operating system of IHS 100.

Chipset 103 may also provide access to one or more display device(s) 108, 113 via graphics processor 107. In certain embodiments, graphics processor 107 may be comprised within a video or graphics card or within an embedded controller installed within IHS 100. In certain embodiments, graphics processor 107 may be integrated within processor 101, such as a component of a system-on-chip. Graphics processor 107 may generate display information and provide the generated information to one or more display device(s) 108, 113 coupled to the IHS 100. The one or more display devices 108, 113 coupled to IHS 100 may utilize LCD, LED, OLED, or other display technologies. Each display device 108, 113 may be capable of receiving touch inputs such as via a touch controller that may be an embedded component of the display device 108, 113 or graphics processor 107, or may be a separate component of IHS 100 accessed via bus 102. As illustrated, IHS 100 may support an integrated display device 108, such as a display integrated into a laptop, tablet, 2-in-1 convertible device, or mobile device. In some embodiments, IHS 100 may be a hybrid laptop computer that includes dual integrated displays incorporated in both of the laptop panels. IHS 100 may also support use of one or more external displays 113, such as external monitors that may be coupled to IHS 100 via various types of couplings.

In certain embodiments, chipset 103 may utilize one or more I/O controllers 110 that may each support hardware components such as user I/O devices and sensors 112. For instance, I/O controller 110 may provide access to one or more user I/O devices such as a keyboard, mouse, touchpad, touchscreen, microphone, speakers, camera and other input and output devices that may be coupled to IHS 100. Each of the supported user I/O devices may interface with the I/O controller 110 through wired or wireless connections. In certain embodiments, sensors 112 accessed via I/O controllers 110 may provide access to data describing environmental and operating conditions of IHS 100. For instance, sensors 112 may include geo-location sensors capable for providing a geographic location for IHS 100, such as a GPS sensor or other location sensors configured to determine the location of IHS 100 based on triangulation and network information. Various additional sensors, such as optical, infrared and sonar sensors, that may provide support for xR (virtual, augmented, mixed reality) sessions hosted by the IHS 100. Such sensors 112 may capabilities for detecting when a user is detected within a certain proximity to IHS 100. For instance, sensors 112 may detect when a user is in close proximity to the IHS 100 and, in some cases, whether the user is facing the display(s) 108, 113. Sensors 112 may also detect when a user is not in close proximity to the IHS 100, but is nonetheless sufficiently nearby that the user may still be actively using IHS 100, such as by monitoring the progress of an application running on an IHS from across the room.

As illustrated, I/O controllers 110 may include a USB controller 111 that, in some embodiments, may also implement functions of a USB hub. In some embodiments, USB controller 111 may be a dedicated microcontroller that is coupled to the motherboard of IHS 100. In other embodiments, USB controller 111 may be implemented as a function of another component, such as a component of a SoC (System on Chip) of IHS 100, embedded controller 126, processors 101 or of an operating system of IHS 100. USB controller 111 supports communications between IHS 100 and one or more USB devices coupled to IHS 100, whether the USB devices may be coupled to IHS 100 via wired or wireless connections. In some embodiments, a USB controller 111 may operate one or more USB drivers that detect the coupling of USB devices and/or power inputs to USB ports 127a-n. USB controller 111 may include drivers that implement functions for supporting communications between IHS 100 and coupled USB devices, where the USB drivers may support communications according to various USB protocols (e.g., USB 2.0, USB 3.0). In providing functions of a hub, USB controller 111 may support concurrent couplings by multiple USB devices via one or more USB ports 127a-n supported by IHS 100.

In some embodiments, USB controller 111 may control the distribution of both data and power transmitted via USB ports 127a-n. For instance, USB controller 111 may support data communications with USB devices that are coupled to the USB ports 127a-n according to data communication protocols set forth by USB standards. The power transmissions supported by USB controller 111 may include incoming charging inputs received via USB ports 127a-n, as well as outgoing power outputs that are transmitted from IHS 100 to USB devices that are coupled to USB ports 127a-n. In some embodiments, USB controller 111 may interoperate with embedded controller 126 in routing power inputs received via USB ports 127a-n to a battery charger 120 supported by the power supply unit 115 of IHS 100 and in routing power outputs from battery 124 to devices coupled to USB ports 127a-n. In some instances, power outputs provided from battery 124 to devices coupled to USB ports 127a-n may be supported by high-performance battery modes that may be used to rapidly charge the batteries of a device coupled to a USB port 127a-n. Such high-performance battery modes may be enabled, disabled or limited by embodiments based on various conditions, such as the software applications of IHS 100 that are currently in use. In addition, embodiments may monitor power demand events resulting from coupling of devices to USB ports 127a-n and may reduce the power outputs that may be supported by these high-performance battery modes in response to detecting such as a power demand event.

Other components of IHS 100 may include one or more I/O ports 116 that support removeable couplings with various types of peripheral external devices. I/O ports 116 may include various types of ports and couplings that support connections with external devices and systems, either through temporary couplings via ports, such as HDMI ports, accessible to a user via the enclosure of the IHS 100, or through more permanent couplings via expansion slots provided via the motherboard or via an expansion card of IHS 100, such as PCIe slots.

Chipset 103 also provides processor 101 with access to one or more storage devices 119. In various embodiments, storage device 119 may be integral to the IHS 100, or may be external to the IHS 100. In certain embodiments, storage device 119 may be accessed via a storage controller that may be an integrated component of the storage device. Storage device 119 may be implemented using any memory technology allowing IHS 100 to store and retrieve data. For instance, storage device 119 may be a magnetic hard disk storage drive or a solid-state storage drive. In certain embodiments, storage device 119 may be a system of storage devices, such as a cloud drive accessible via network interface 109.

As illustrated, IHS 100 also includes a BIOS (Basic Input/Output System) 117 that may be stored in a non-volatile memory accessible by chipset 103 via bus 102. In some embodiments, BIOS 117 may be implemented using a dedicated microcontroller coupled to the motherboard of IHS 100. In some embodiments, BIOS 117 may be implemented as operations of embedded controller 126. Upon powering or restarting IHS 100, processor(s) 101 may utilize BIOS 117 instructions to initialize and test hardware components coupled to the IHS 100. The BIOS 117 instructions may also load an operating system for use by the IHS 100. The BIOS 117 provides an abstraction layer that allows the operating system to interface with the hardware components of the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Some IHS 100 embodiments may utilize an embedded controller 126 that may be a motherboard component of IHS 100 and may include one or more logic units. In certain embodiments, embedded controller 126 may operate from a separate power plane from the main processors 101, and thus from the operating system functions of IHS 100. In some embodiments, firmware instructions utilized by embedded controller 126 may be used to operate a secure execution environment that may include operations for providing various core functions of IHS 100, such as power management and management of certain operating modes of IHS 100.

Embedded controller 126 may also implement operations for interfacing with a power supply unit 115 in managing power for IHS 100. In certain instances, the operations of embedded controller may determine the power status of IHS 100, such as whether IHS 100 is operating strictly from battery power, whether any charging inputs are being received by power supply unit 115, and/or the appropriate mode for charging the one or more battery cells 124*a-n* using the available charging inputs. Embedded controller 126 may support routing and use of power inputs received via a USB port 127*a-n* and/or via a power port 125 supported by the power supply unit 115. In addition, operations of embedded controller 126 may interoperate with power supply unit 115 in order to provide battery status information, such as the charge level of the cells 124*a-n* of battery 124.

In some embodiments, embedded controller 126 may also interface with power supply unit 115 in monitoring the battery state of battery 124, such as the relative state of charge of battery 124, where this charge level of the battery 124 may be specified as a percentage of the full charge capacity of the battery 124. In some instance, when operating from power stored in battery system 124, embedded controller 126 may detect when the voltage of the battery system 124 drops below a low-voltage threshold. When the charge level of battery 124 drops below such a low-voltage threshold, embedded controller 126 may transition the IHS to an off-power state in implementing a battery protection mode that preserves a minimal power level in battery 124.

Embedded controller 126 may also implement operations for detecting certain changes to the physical configuration of IHS 100 and managing the modes corresponding to different physical configurations of IHS 100. For instance, where IHS 100 is a laptop computer or a convertible laptop computer, embedded controller 126 may receive inputs from a lid position sensor that may detect whether the two sides of the laptop have been latched together, such that the IHS is in a closed position. In response to lid position sensor detecting latching of the lid of IHS 100, embedded controller 126 may initiate operations for shutting down IHS 100 or placing IHS 100 in a low-power mode.

In this manner, IHS 100 may support the use of various power modes. In some embodiments, the power modes of IHS 100 may be implemented through operations of the embedded controller 126 and power supply unit 115. In various embodiments, a mobile IHS 100 may support various low power modes in order to reduce power consumption and/or conserve power stored in battery 124. The power modes may include a fully on state in which all, or substantially all, available components of mobile IHS 100 may be fully powered and operational. In a fully off mode, processor(s) 101 may powered off, any integrated storage devices 119 may be powered off, and/or integrated displays 108 may be powered off. In an intermediate low-power mode, various components of mobile IHS 100 may be powered down, but mobile IHS 100 remains ready for near-immediate use. In a standby power mode, which may be referred to as a sleep state or hibernation state, state information may be stored to storage devices 119 and all but a selected set of components and low-power functions of mobile IHS 100, such as standby functions supported by embedded controller 126, are shut down.

As described, IHS 100 may also include a power supply unit 115 that receives power inputs used for charging batteries 124 from which the IHS 100 operates. IHS 100 may include a power port 125 to which an AC adapter may be coupled to provide IHS 100 with a supply of DC power. The DC power input received at power port 125 may be utilized by a battery charger 120 for recharging one or more internal batteries 124 of IHS 100. As illustrated, batteries 124 utilized by IHS 100 may include one or more cells 124*a-n* that may connected in series or in parallel. Power supply unit 115 may support various modes for charging the cells 124*a-n* of battery 124 based on the power supply available to IHS 100 and based on the charge levels of the battery system 124. In certain embodiments, power supply unit 115 of IHS 100 may include a power port controller 114 that is operable for configuring operations by power port 125. In certain embodiments, power port controller 114 may be an embedded controller that is a motherboard component of IHS 100, a function supported by a power supply unit 115 embedded controller, or a function supported by a system-on-chip implemented by processors 101.

In various embodiments, an IHS 100 does not include each of the components shown in FIG. 1. In various embodiments, an IHS 100 may include various additional components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

Figure 2:
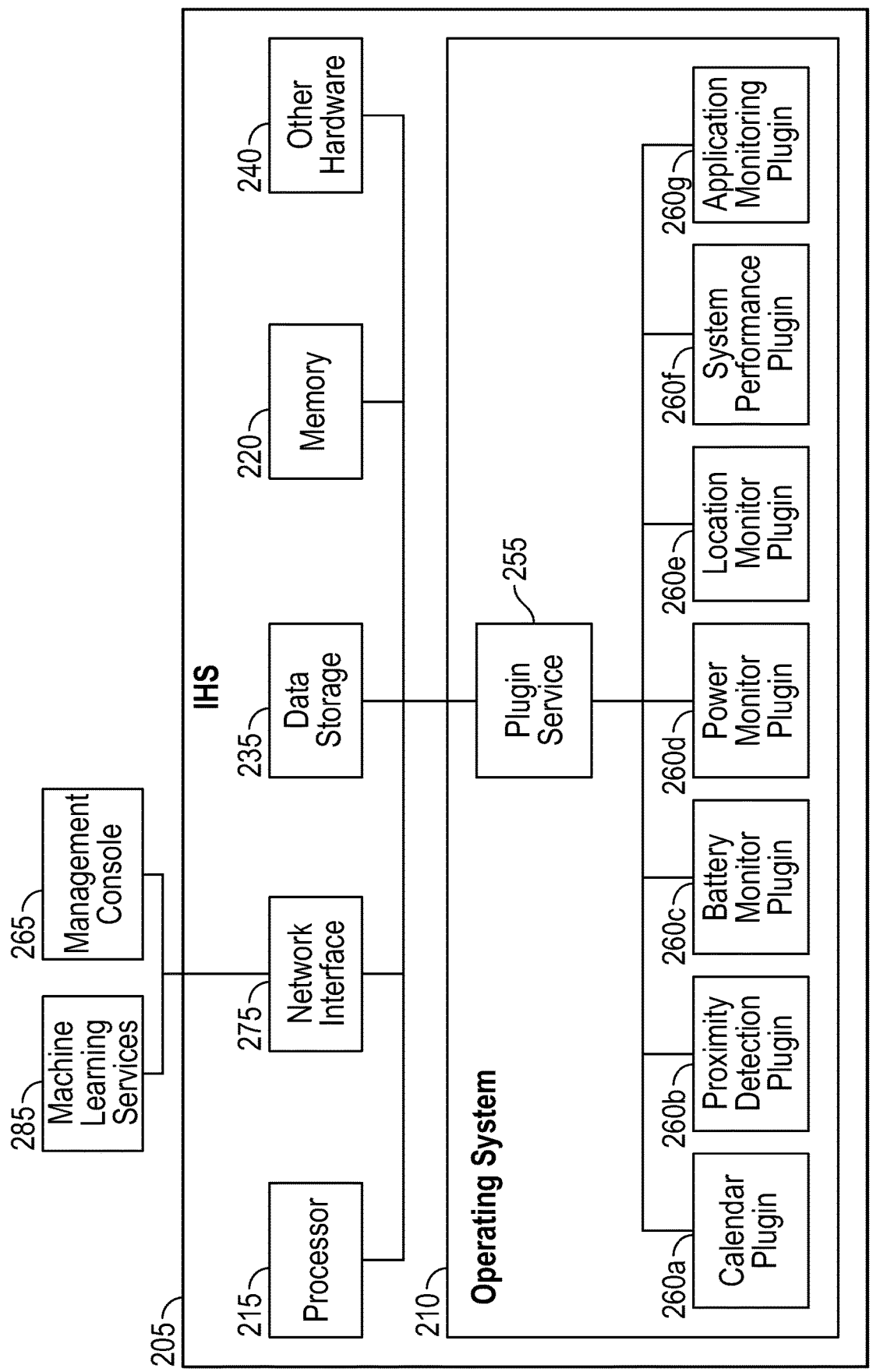
FIG. 2 is block diagram depicting certain components of a system operable according to various embodiments for managing the use of available modes for drawing power from the rechargeable batteries of an IHS.

FIG. 2 is block diagram depicting certain components of a system configured according to various embodiments for managing the use of available modes for drawing power from the rechargeable batteries of an IHS 205. As illustrated, IHS 205 may include an operating system 210 that supports the use of the hardware and software resources of the IHS. In the illustrated embodiment, the hardware resources of IHS 205 include the main processor(s) 215, a network interface 275, persistent storage drive(s) 235, system memory 220 and various other hardware resources 240 that may include integrated display(s), pointing devices, keyboards, sensors, and/or graphics processors, such as described with regard to the IHS of FIG. 1.

Embodiments may utilize a plugin architecture in which a plugin service 255 manages access to IHS hardware resources by a set of software plugins 260*a-g*. As illustrated, plugins 260*a-g* supported by an operating system 210 may include various types of plugins that provide specific services or capabilities. In some embodiments, the plugins 260*a-g* rely on a plugin service 255 in order to access the hardware resources 215, 275, 235, 220, 240 of the IHS 205. Accordingly, the plugin service 255 may provide plugins 260*a-g* with necessary hardware resources for carrying out their respective functions, but may prevent plugins 260*a-g* from consuming or otherwise encumbering hardware resources of IHS 205.

In some embodiments, the plugin architecture may support a remote management console 265 that may allow an administrator to configure various aspects of the operation of the plugin service 255 and of the individual plugins 260*a-g*. For instance, remote console 265 may allow administrators to configure capabilities of the plugin service 255 to collect data from the individual plugins 260*a-g* and to share the collected data with a machine learning service 285. As described in additional detail below, the data collected by the machine learning service 285 may be utilized to generate personalized models for the use of high-performance battery modes in a manner that is conserves available battery power for use in support of prioritized software applications. The machine learning service 285 may also generate personalized models that are used to select power throttling characteristics for use with high-performance battery modes in support of specific prioritized software applications. For instance, high-performance battery modes may be enabled for use with a prioritized software application, but models generated by machine learning service 285 may specify a specific power throttling factor for use in support of a particular application, thus further modulating the battery power that may be utilized in support of specific software application. Through the selection of different power throttling factors, different prioritized software applications may be supported via graded use of high-performance battery modes.

As illustrated, a plugin service 255 may support a variety of plugins 260*a-g*, where these plugins may be utilized by embodiments in managing the use of available modes for drawing power from the rechargeable batteries of an IHS. As described, available battery modes of an IHS 205 may support high-performance computing tasks by supplying sufficient power to meet the peak power demands generated by such computing tasks. However, such battery modes may result in rapid depletion of the stored charge of the battery. Embodiments may utilize information collected by plugins 260*a-g* in determining when to utilize such high-performance battery modes and when to limit the power output that may be generated by such battery modes. As described in additional detail below, embodiments may enable use of high-performance battery modes for the use of certain prioritized software applications and may restrict the use of high-performance battery modes when non-prioritized software applications are in use, or when the use of a prioritized software application does not exceed a utilization threshold.

Accordingly, an application monitoring plugin 260*g* may be used to monitor the software applications of IHS 205 that are currently in use. In some embodiments, the application monitoring plugin 260*g* may interface with the operating system 210 in order to determine the software applications that are currently running in the operating system, where such applications may include core components of the operating system, such as an integrated firewall, and where such applications may also include third-party software, such as a gaming application or a CAD program. The software monitoring plugin 260*g* may evaluate the list of software applications reported by the operating system against a list of applications that have been prioritized for use of available battery power. In some embodiments, such a list of prioritized software applications may be generated by a user of the IHS 205 or by an administrator of the IHS 205. For instance, a user may be prompted to configure the utilization of the rechargeable batteries of IHS 205 by selecting certain software applications of the IHS as the prioritized applications that the user prefers to support using high-performance battery modes, even though use of such battery modes may result in rapid discharge of the batteries of IHS 205. As described in additional detail below, in certain embodiments, the prioritized applications selected by the user may be refined through the use of machine learning models that identify conditions during which use of high-performance battery modes may be limited in order to preserve the charge level of the battery of IHS 205, while still supporting graded or otherwise limited power demands of prioritized applications. In some embodiments, in addition to selecting prioritized software applications, the user may rank the prioritized application or otherwise assign the applications to tiers. Based on such rankings, greater user of high-performance battery modes may be allocated for use with higher ranked applications. In some embodiments, such rankings may be generated by the described machine learning models based on evaluation of the actual power demands generated by applications and the degree to which high-performance battery modes may be utilized in support of an application without affecting the battery runtimes that can be supported.

In support of the ability to determine when a software application of IHS 205 is in active use by a user of the IHS, plugin service 255 may also support a proximity detection plugin 260*b*. As described with regard to FIG. 1, an IHS may include various sensors that may be utilized in order to determine a user's presence in proximity to an IHS. Proximity detection plugin 260*b* may interface with such sensor capabilities to detect scenarios where a user is no longer in proximity to IHS 205. For instance, line-of-sight and/or infrared sensors of IHS 205 may be queried by proximity detection plugin 260*b* to determine whether a user is in proximity to the IHS 205. Based on such queries, the user may be determined to be sitting very near IHS 205, such that the user is likely to be actively using the software applications that are being run by IHS 205. The user may instead be determined to be at some distance from IHS 205, such as within the same room as the IHS, and may thus be deemed less likely to be actively using the applications being run by IHS 205. The data gathered by the sensors of IHS 205 may also be used to deduce that the user is not within a detectable proximity to IHS 205, and is thus unlikely to be actively using the applications being run by IHS 205. Based on such proximity determinations supported by the proximity detection plugin 260*b*, high-performance battery modes may be selectively enabled based on whether the user is actively using the software applications being run by the IHS 205. As described in additional detail below, such determinations may be used to limit or power throttle the use of high-performance battery modes even though a prioritized software application is being run by the IHS 205 in scenarios where the user cannot be identified as being within a proximity to the IHS.

As illustrated, the plugins supported by the plugin service 255 may also include a calendar plugin 260*a* that may interface with calendaring applications running within the operating system 210 of IHS 205. In such embodiments, events that have been calendared by the user of IHS 205 may be evaluated in order to determine whether available battery power should be conserved rather than being utilized to support high-performance computing tasks. For instance, calendar plugin 260*a* may identify a scheduled meeting that is to commence in the near future, such as within the next 30 minutes. In some circumstances, available battery power may be conserved for use during this scheduled meeting by restricting the use of high-performance battery modes. In some embodiments, the location of the scheduled meeting may also be used to determine whether to restrict use of high-performance battery modes. For instance, if the scheduled meeting is to be conducted while the user is at the present location and the IHS 205 is coupled to an AC power source at the present location, high-performance battery modes may be utilized without restriction during the time interval leading up to the meeting. However, if the scheduled meeting is to be conducted at an unknown location or at a different location that requires movement by the user, the information collected by calendar plugin 260*a* may be used to restrict use of high-performance battery modes during a certain time interval leading up to the meeting.

In further support of these capabilities, the plugin service may also support a location monitor plugin 260*e* that may interface with the location detecting capabilities of IHS 205, such as the GPS and network triangulation capabilities described with regard to FIG. 1, in order to determine whether to utilize high-performance battery modes. For instance, upon identifying a scheduled meeting, the location monitor plugin 260e may evaluate the present location of the IHS 205 against the location of the scheduled meeting in order to determine if the user is likely to move to a new location in the near future. In such circumstances, future availability of AC power may be unknown, such that available battery power should be conserved. As a result, high-performance battery modes may be limited or prohibited during such intervals when an upcoming change in location is anticipated.

As illustrated, the plugin service 255 may also support a battery monitor plugin 260c that collects battery usage information for use in determining whether to utilize high-performance battery modes with respect to specific software applications and in various scenarios, such as the location at which a software application is being utilized. Through capabilities supported by plugin service 255, battery monitor plugin 260c may receive notifications of the location of the IHS 205 and of any changes to the location of the IHS 205. In addition, battery monitor plugin 260c may receive notifications from the application monitoring plugin 260g of the detected use of software applications that have been prioritized for use of available battery power. Additionally, battery monitoring plugin 260c may interface with the power supply of IHS 205, such as power supply unit 115 of the IHS of FIG. 1, in tracking metrics that provide indications of changes in the relative state of charge of the batteries of the IHS. Through evaluation of the combination of such data sources, battery monitor plugin 260c may characterize battery power discharges during intervals when high-performance battery modes are being used in support of specific software applications, and may further characterize the battery power discharges during intervals when a specific software application is utilized at different locations. For example, such evaluation of intervals of use of a CAD program of an IHS may confirm that use of this CAD program results in sustained peak power demands that can only be supported using high-performance battery modes and that such power demands are present regardless of the location at which the program is used. Accordingly, embodiments may restrict use of high-performance battery modes for such programs during intervals when a change in location is expected, such as part of a regular commute schedule, or when a scheduled event is approaching.

In a similar manner to the battery monitor plugin 260c, a power monitor plugin 260d may be used to characterize the power demands of IHS 205 during intervals when a specific prioritized application is in use. For instance, the power monitor plugin 260d may interface with a power supply unit and/or processor of the IHS 205 in order to track the power demands on IHS 205, such as reported MPP (maximum peak power) and SPP (sustained peak power) reported by processor of the IHS, and may establish correlations between power demands and specific prioritized software applications of the IHS. Using such power demand information provided by power monitor plugin 260d, software applications may be identified that are associated with high power demands, where the magnitude of these power demands results in heavy use of high-performance battery modes and quick discharge of batteries of IHS 205. Although such applications may be prioritized, the need to conserve available battery power may nonetheless restrict the use of high-performance battery modes, such as by throttling the amount of battery power that may by drawn in support of such applications that have been demonstrated to result in high power demands that are capable of resulting in significant battery discharge.

As illustrated, in some embodiments, the plugin service 255 may also support a system monitor plugin 260f that collects various types of system information for use in determining whether to utilize high-performance battery modes with respect to specific software applications and in various scenarios. For instance, system monitor plugin 260f may track the status of graphical user interfaces associated with prioritized software applications of IHS 205. While such software applications are running, a user may choose to minimize user interfaces associated with the application, or may obscure the user interfaces with graphical user interfaces from other applications. Embodiments may utilize such information collected by system monitor plugin 260 in order to determine whether to enable high-performance battery modes in support of a specific software application. In scenarios where the user interfaces of the application are not visible to the user, embodiments may refrain from use of high-performance battery modes in support of the software application.

Figure 3:
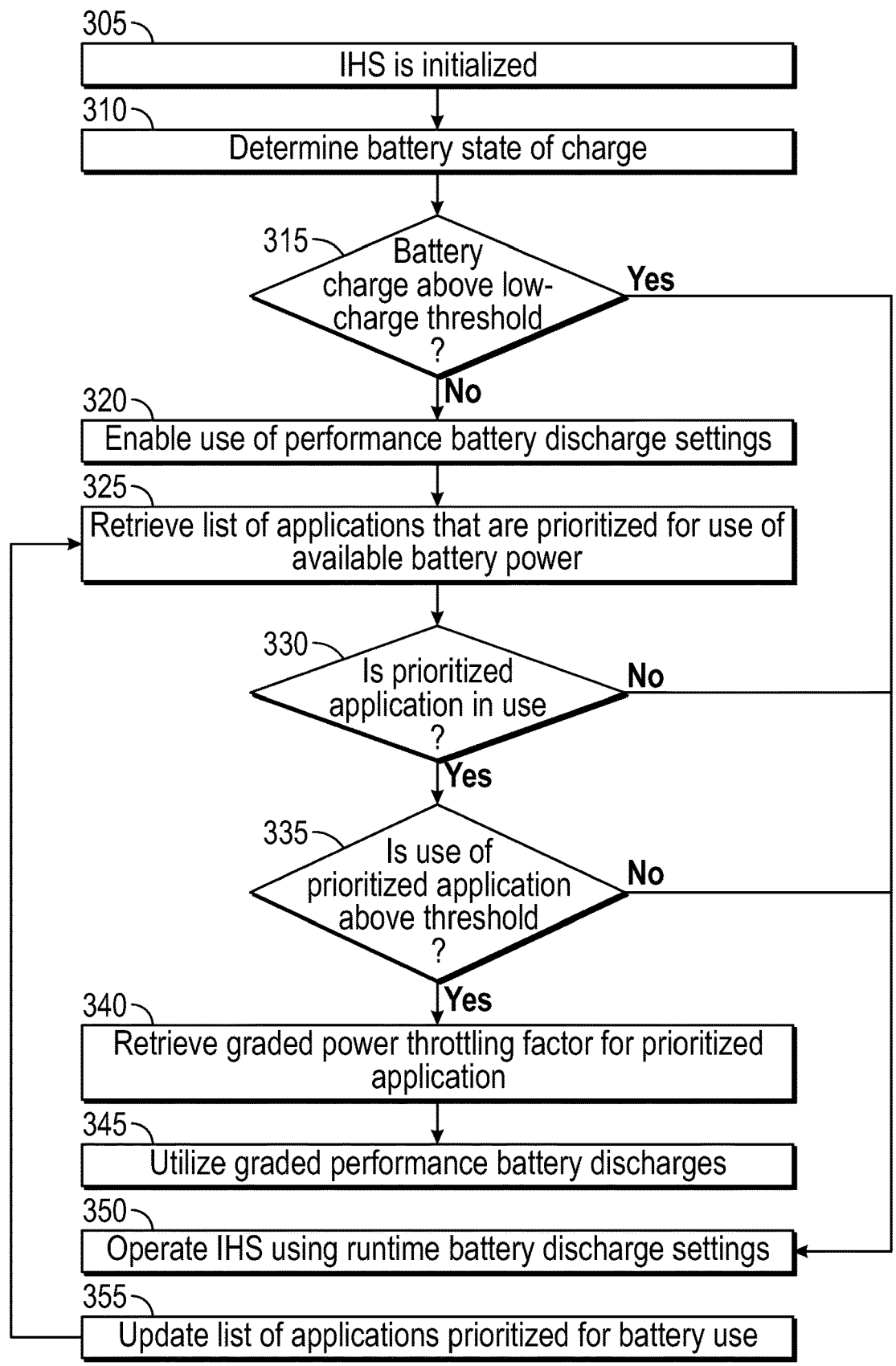
FIG. 3 is a flow chart diagram illustrating certain steps of a process according to various embodiments for managing the use of available modes for drawing power from the rechargeable batteries of an IHS.

FIG. 3 is a flow chart diagram illustrating certain steps of a process according to various embodiments for managing the use of available modes for drawing power from the rechargeable batteries of a portable IHS. As illustrated, embodiments may begin at block 305 with the initialization of an IHS, such as the IHSs described with regard to FIGS. 1 and 2. Once the IHS has been initialized and the operating system of the IHS is booted, the user may commence operation of the IHS and may thus initiate use of software applications that are supported by the operating system of the IHS. As described, one or more of these software applications may be designated as applications that are prioritized for use of available battery power of the portable IHS. Embodiments may thus determine when such prioritized applications are in active use and in what scenarios to enable or to limit the use of high-performance battery modes in support of these applications.

Determinations regarding use of high-performance battery modes may commence, at block 310, using queries that provide the state of charge of the battery of the IHS. In some instances, the state of charge of a rechargeable battery may be indicated as a percentage of the full charge capacity of the battery. At block 315, the state of charge of the battery may be evaluated against a low-charge threshold. If the state of charge of the battery is below this low-charge threshold, use of the battery may be limited, at block 350, to the use of battery modes that preserve the runtime of the battery. In such circumstances where the state of charge of the battery is below the low-charge threshold, the IHS may be operated without use of high-performance battery modes. If the state of charge of the battery is above this threshold, at block 320, use of high-performance battery modes may be enabled.

At block 325, a list of prioritized software applications may be retrieved. In some instances, a list of prioritized software applications may be generated based on selections made by a user of the IHS. For instance, during a configuration of the battery management capabilities of an IHS, a user may be presented with options for selecting, and in some instances ranking, software applications that are prioritized for use of available battery capacity. For instance, a user may select software applications that are utilized for the user's employment as prioritized applications, such as a software development application, an electronic circuit design application, a graphic design effort application or a word processing application. In other instances, the user may select software applications as prioritized based on other personal preferences, such as by selecting a gaming application or a streaming media application. In this manner, an individual user may specify a personalized list of prioritized software applications, where this list reflects the user's preferences for use of available battery power. As indicated in FIG. 3, at block 355, the user may update this list of prioritized applications, or the ranking of applications in this list, from time to time. For instance, the listing of prioritized applications may be updated in anticipation of a period of travel during which the IHS will be utilized to support work functions or may be updated based on personal preferences to support gaming operations without regard to preserving battery runtimes. In some embodiments, the list of prioritized applications may be modified based on inputs provided by machine learning capabilities that evaluate battery discharge characteristics in support of specific software applications. For instance, observations of prolonged peak power demands and resulting rapid battery discharge in support of a gaming application may result in the machine learning capabilities removing this application from the list of prioritized software applications, or lowering the ranking of this application within the list of prioritized application such that more restricted use of high-performance battery modes may be utilized for the lower ranked application.

Based on the retrieved list of prioritized software applications, at block 330, the software applications that are currently in use are evaluated to determine whether any of the prioritized software applications are currently in use. As described above, such determinations may be made by an application monitoring plugin that is configured to track the applications that are currently in use and identify use of applications that have been designated as prioritized. Also as described, determinations regarding whether an application is in use may depend on whether an application is determined to be actively in use by a user of the IHS. For instance, an application may not be deemed to be actively in use when graphical user interfaces associated with the application are not visible to the user via a display of the IHS, or based on a determination that the user is not detected in proximity to the IHS. Accordingly, at block 335, further determinations may be made regarding whether use of a prioritized software application exceeds a specified utilization threshold, such as a threshold requiring user proximity to the IHS or a threshold requiring the user interface of the application to be at least partially visible to the user. If a prioritized application is not in use, or use of a prioritized application does not exceed a specified utilization threshold, at block 350, battery power is utilized without relying on high-performance battery modes, thus conserving battery runtime.

As described, in some embodiments high-performance battery modes may be enabled for use of prioritized software applications, but power outputs using such high-performance battery modes may be modulated for some or all of these prioritized software applications. For instance, high-performance battery modes may be enabled for use with a CAD software application, but observed patterns of rapid battery discharge when this CAD application is utilized may result in the output of these high-performance battery modes to be throttled to 50 percent of the power output capacity that can be generated using such battery modes. A streaming media application that has been designated as a prioritized application may exhibit significantly lower peak power demands than the CAD application and may thus be supported using 80 percent of the output capacity of the high-performance battery modes. In some embodiments, the prioritized software applications may be ranked or otherwise assigned into tiers, where higher ranked applications are provided greater use of high-performance battery modes and lower ranked applications are provided more limited use of high-performance battery modes. In such embodiments, a relatively low ranked gaming application may be supported using high-performance battery modes that are throttled to 20 percent of the battery power output capacity.

At block 340, any such limitations on the use of high-performance battery modes may be retrieved. In some embodiments, such limitations may be specified as a power throttling factor that specifies an upper limit on the power outputs that may be provided using battery discharges. For example, a power throttling factor may cap the power output of a battery to 50 percent of its power output capacity. In some embodiments, such power throttling factors may be determined based on data collected by plugins, such as described with regard to FIG. 2, where such data is collected based on monitoring of power demands, battery discharges and system performance characteristics while a specific software application is in use. For instance, an application that exhibits high peak power demands over short durations may be assigned a power throttling factor that allows greater use of high-performance battery modes in comparison to an application that exhibits peak power demands that are lower in magnitude, but are sustained for a prolonged duration and thus result in significant battery discharge.

The selected power throttling factor associated with a u prioritized software application that is currently in use is utilized, at block 345, to provide high-performance battery mode discharges that are capped according to the power throttling factor. In scenarios where multiple prioritized software applications are in use concurrently, embodiments may utilize various policies for determining the appropriate power throttling factor to be used in support of these multiple applications. For instance, in scenarios where multiple software applications are concurrently in use and each of these applications is associated with a separate power throttling factor, embodiments may utilize the most conservative of these power throttling factors, thus choosing to enforce the most stringent of the power limitations specified by the applicable power throttling factors in order to conserve battery power. Other embodiments may choose the most aggressive of the applicable power throttling factors, thus choosing to utilize as much of the available battery charge as is required to support the application that has been granted the greatest use of high-performance battery modes. Other embodiments may choose to calculate a sum of the various power throttling factors and may provide battery outputs that can concurrently support each of the applications, as long as the sum of their power throttling factors does not exceed the total output capacity of the battery.

Figure 4:
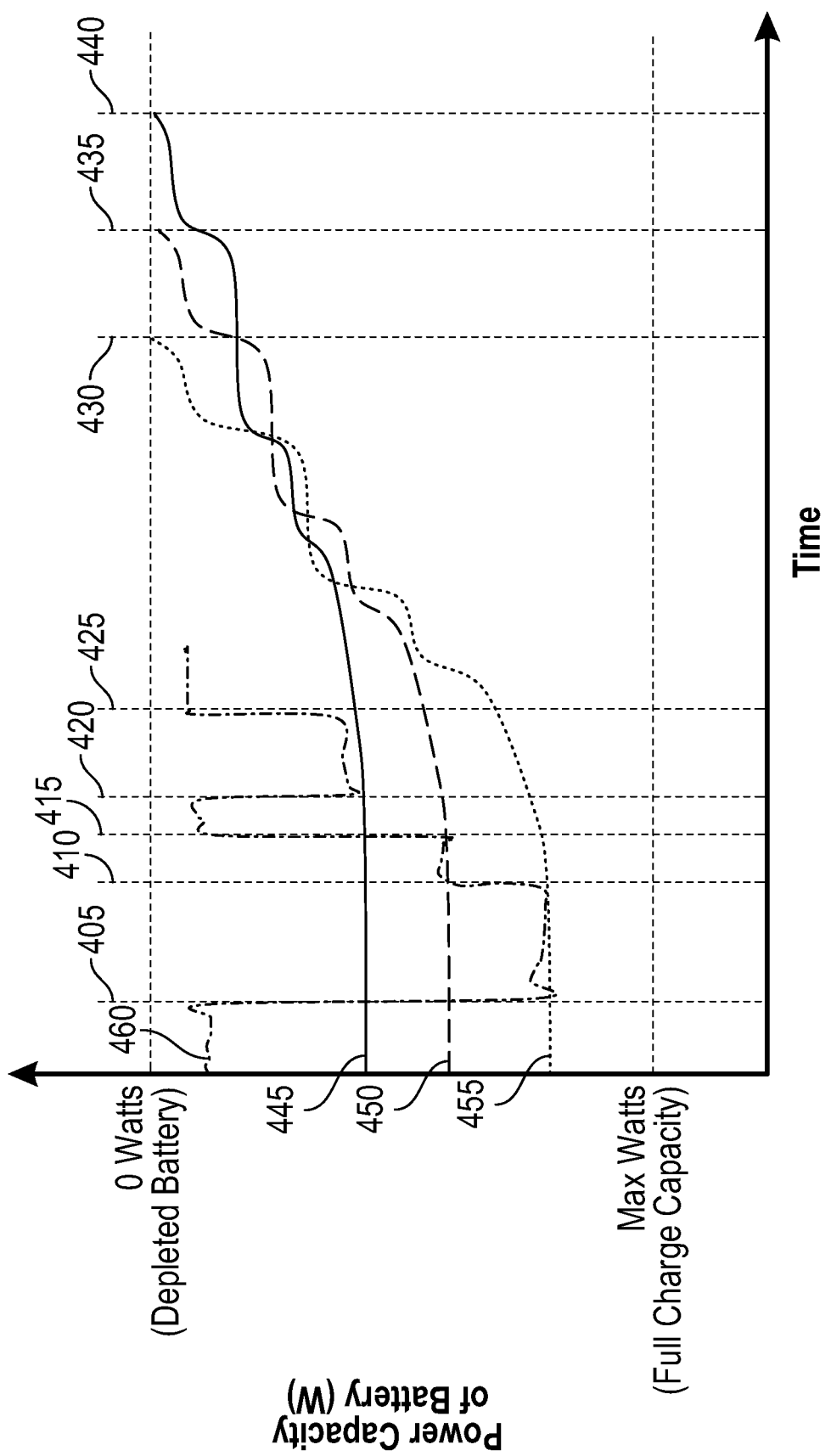
FIG. 4 is a graph diagram illustrating certain aspects of the operation of a system configured according to various embodiments for managing the use of available modes for drawing power from the rechargeable batteries of an IHS.

FIG. 4 is a graph diagram illustrating certain aspects of the operation of a system configured according to various embodiments for managing the use of available modes for drawing power from the rechargeable batteries of an IHS. In the graph of FIG. 4, three battery discharge plots 445, 450, 455 are illustrated, each of which represents a different battery mode. The battery mode discharge plot 455 with the highest discharge rate supports power outputs closest to the maximum output wattage supported by the battery, and thus results in the quickest discharge of the battery at time 430. The battery mode discharge plot 445 with the lowest discharge rate supports lower power outputs, and thus preserves the runtime capabilities of the battery until time 440. An intermediate battery mode discharge plot 450 supports battery discharges between those of the battery mode discharges of of plots 455 and 445, and thus provides an intermediate battery runtime that ends at time 435.

As described, embodiments support capabilities for selecting battery modes to be utilized in support of specific software applications. FIG. 4 includes a plot 460 that represents the battery power that is discharged using embodiments in support of software applications that have been prioritized for utilization of available battery charge. Initially, the battery power that is discharged in support of prioritized software applications remains minimal. However, at time 405, a prioritized software application is launched. As described above, upon initiating use of this prioritized software application and confirming its active use above a specified threshold, a power throttling factor may be selected for providing power while this application is in use. In the scenario illustrated in FIG. 4, a power throttling factor has been selected that supports the highest rate of discharge of the batteries. Accordingly, at time 405, a power output is provided according to the battery mode corresponding to discharge plot 455.

Power is provided according to the battery mode of discharge plot 455 until time 410, at which time power output is decreased to the intermediary battery mode of discharge plot 450. As described, multiple prioritized software applications may be in use concurrently. In one such scenario, use of a first application associated with the highest battery discharge plot 455 ends at time 410, but use of a second application continues, where this second application is associated with a more restricted power output level and is thus provided power according to the battery mode of discharge plot 450. In another scenario, use of the first software application does not and at time 410, but the power output utilized in support of this application is nonetheless downgraded to use of the battery mode of discharge plot 450 in response to detecting a change in location or an upcoming scheduled event or location change that warrants reducing battery discharges and conserving battery runtime.

At time 415, use of prioritized software applications ends and the power output 460 of the battery returns to minimal levels. At time 420, use of another prioritized software application is detected. As before, active use of the application above some threshold amount may be confirmed and a power throttling factor associated with the application may be determined. Based on the selected power throttling factor, the software application may be determined to correspond to the battery mode of discharge plot 445 that supports limited peak power demands in exchange for supporting an extended battery run-time. At time 425, use of this software application may end and use of high-performance battery modes may be disabled. However, in some scenarios use of high-performance battery modes may be disabled at 425 instead due to an inability to detect the user in proximity to the IHS, or in response to the charge level in the battery dropping below a specified threshold. In this manner, power throttling factors associated with different prioritized applications may be utilized to select a battery mode that supports high performance capabilities or that extends battery runtime.

Figure 5:
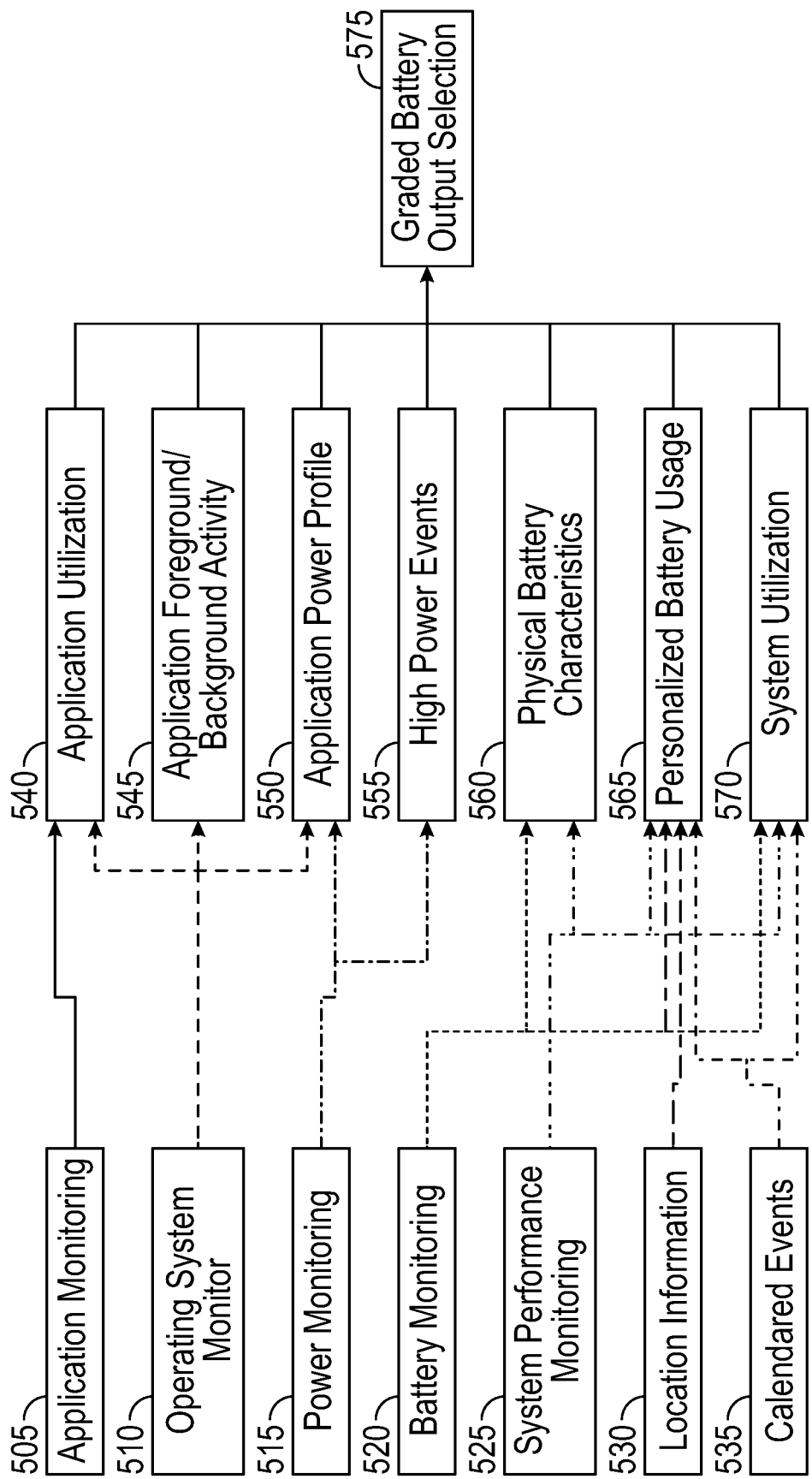
FIG. 5 is a flow chart diagram illustrating the operation of a system configured according to various embodiments for managing the use of available modes for drawing power from the rechargeable batteries of an IHS.

FIG. 5 is a flow chart diagram illustrating the operation of a system configured according to various embodiments for managing the use of available modes for drawing power from the rechargeable batteries of an IHS. In particular, the diagram of FIG. 5 depicts data flows that may be used according to embodiments in the selection of power throttling factors for use in supporting specific software applications. As described with regard to FIG. 2, an IHS may include application monitoring 505 capabilities that track the software applications that are being run within the operating system of an IHS. An IHS may also include an operating system monitor 510 that tracks additional information about the use of software applications, such as whether the user interfaces of a software application are visible to the user, or whether the software application is operating strictly in the background. The monitored foreground and background activity of an application may be characterized at block 545 and used in the selection of a power throttling factor for use with an application. As illustrated, the information collected by the application monitor 505 and the operating system monitor 510 may be combined to characterize the utilization of specific applications at 540, such as characterizing when an application is in use and when its use surpasses a utilization threshold.

As described, monitoring capabilities utilized by embodiments may include power monitoring 515 that tracks the power demands, such as maximum peak power and sustained peak power, placed on the power supply unit of an IHS. As illustrated, this power monitoring information may be combined with monitored application activity in generating a power profile 550 for individual software applications, where this profile characterizes the magnitude and duration of high-power events associated with a specific software application. The data collected by a power monitor 515 may also be used to characterize the various high-power events 555 across all supported software applications. The monitoring capabilities utilized by embodiments may also include a battery monitoring capability 520 that tracks the power discharges and other characteristics of the battery of an IHS. Such monitored battery information may be used to track physical battery characteristics 560, such as the age of a battery and the full charge capacity that is supported by a battery as it degrades.

In some embodiments, more personalized monitoring may be conducted that includes monitoring of a user's calendar events 535, monitoring location information 530 associated with the IHS's current location, determining the expected location of the IHS during upcoming intervals and monitoring various aspects of system performance 525. Such personalized monitoring may be combined in order to characterize personalized battery usage 565 that accounts for factors such as where the user is located, events in which the user is scheduled to participate, and typical battery discharges observed in response to the user utilizing a specific application. Models of personalized battery usage may thus provide expected battery use in various scenarios based on the user's prior use of applications in similar scenarios. In this same manner, a model of system utilization 570 may also be generated that characterizes use of an IHS by a particular user. Based on such sources of information, a graded battery output may be selected for use with a specific software application, where this graded battery output may be based on a power throttling factor that is used to select a battery mode during use of the software application.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS) comprising:
one or more rechargeable batteries, wherein individual rechargeable batteries of the one or more rechargeable batteries comprise one or more cells;
one or more processors;
a memory device coupled to the one or more processors, the memory device storing computer-readable instructions that, upon execution by the one or more processors, cause execution of an operating system of the IHS, wherein the operating system is configured to:
monitor software applications in use by a user of the IHS;
detect use of a first software application by the user, wherein the first software application has been designated as a prioritized application of one or more prioritized applications that enable use of a high-performance battery mode of the one or more rechargeable batteries of the IHS;
select a power throttling factor for use in drawing power from the one or more rechargeable batteries of the IHS while the first software application, that has been designated as the prioritized application, is in use, wherein the power throttling factor specifies at least an upper limit on power drawn from the one or more rechargeable batteries;
transmit the selected power throttling factor to an embedded controller of the IHS; and
notify the embedded controller when the first software application, that has been designated as the prioritized application, is no longer in use by the user of the IHS; and
the embedded controller comprising a memory having program instructions stored thereon that, upon execution by a logic unit of the embedded controller, cause the embedded controller to:
receive the selected power throttling factor from the operating system of the IHS; limit power drawn from the one or more rechargeable batteries of the IHS according to the selected power throttling factor;
receive a notification from the operating system that the first software application is no longer in use by the user of the IHS; and
based, at least in part, on the received notification that the first software application, that has been designated as the prioritized application, is no longer in use, restrict use of the high-performance battery mode.

2. The IHS of claim 1, wherein the one or more prioritized applications are selected by the user of the IHS, and wherein the one or more prioritized applications selected by the user are modified based on a machine learning model.

3. The IHS of claim 1, wherein the selected power throttling factor is selected for the first software application based on a ranking of the first software application within the one or more prioritized applications.

4. The IHS of claim 1, wherein the selected power throttling factor is selected based on an event scheduled by the user.

5. The IHS of claim 4, wherein the selected power throttling factor is selected based on a location of the scheduled event.

6. The IHS of claim 1, wherein the embedded controller is notified the first software application is no longer in use in response to an inability to detect the user in proximity to the IHS.

7. The IHS of claim 1, wherein the embedded controller is notified the first software application is no longer in use in response to detecting a user interface of the first software application is not visible to the user via a display of the IHS.

8. The IHS of claim 1, wherein the selected power throttling factor is selected based on prior observations of peak power use when the first software application was previously in use.

9. A method for powering an Information Handling System (IHS), the method comprising:
monitoring software applications in use by a user of the IHS, wherein the monitored software applications comprise processes running within an operating system of the IHS;
based on the monitoring, detecting use of a first software application of the operating system by the user, wherein the first software application has been designated as a prioritized application of one or more prioritized applications that enable use of a high-performance battery mode of one or more rechargeable batteries of the IHS;

selecting a power throttling factor for use in limiting power that is drawn from the one or more rechargeable batteries of the IHS while the first software application, that has been designated as the prioritized application, is in use by the user of the IHS, wherein the power throttling factor specifies at least an upper limit on power drawn from the one or more rechargeable batteries;

transmitting the selected power throttling factor to an embedded controller of the IHS; notifying the embedded controller when the first software application, that has been designated as the prioritized application, is no longer in use by the user of the IHS;

receiving, by the embedded controller of the IHS, the selected power throttling factor; limiting, by the embedded controller, power drawn from the one or more rechargeable batteries of the IHS according to the power throttling;

receiving, by the embedded controller, a notification that the first software application is no longer in use by the user of the IHS; and based, at least in part, on the received notification that the first software application, that has been designated as the prioritized application, is no longer in use, restricting the use, by the embedded controller, of the high-performance battery mode.

10. The method of claim 9, wherein the one or more prioritized applications are selected by the user of the IHS, and wherein the one or more prioritized applications selected by the user are modified based on a machine learning model that is trained based on monitored power demands during prior use of the first software application by the user.

11. The method of claim 9, wherein the selected power throttling factor is selected for the first software application based on a ranking of the first software application within the one or more prioritized applications.

12. The method of claim 9, wherein the selected power throttling factor is selected based on an event scheduled by the user.

13. The method of claim 12, wherein the selected power throttling factor is selected based on a location of the scheduled event.

14. The method of claim 9, wherein the embedded controller is notified the first software application is no longer in use in response to an inability to detect the user in proximity to the IHS.

15. The method of claim 9, wherein the embedded controller is notified the first software application is no longer in use in response to detecting a user interface of the first software application is not visible to the user via a display of the IHS.

16. The method of claim 9, wherein the selected power throttling factor is selected based on prior observations of peak power use when the first software application was previously in use.

17. A non-transitory computer-readable storage device having instructions stored thereon for powering an Information Handling System (IHS), wherein execution of the instructions by one or more processors of the IHS causes the one or more processors to:

monitor software applications in use by a user of the IHS, wherein the monitored software applications comprise processes running within an operating system of the IHS;

based on the monitoring, detect use of a first software application of the operating system by the user, wherein the first software application has been designated as a prioritized application of one or more prioritized applications that enable use of a high-performance battery mode of one or more rechargeable batteries of the IHS;

select a power throttling factor for use in limiting power that is drawn from the one or more rechargeable batteries of the IHS while the first software application, that has been designated as the prioritized application, is in use by the user of the IHS, wherein the power throttling factor specifies at least an upper limit on power drawn from the one or more rechargeable batteries;

transmit the selected power throttling factor to an embedded controller of the IHS;

notify the embedded controller when the first software application, that has been designated as the prioritized application, is no longer in use by the user of the IHS;

receive, by the embedded controller of the IHS, the selected power throttling factor;

limit, by the embedded controller, power drawn from the one or more rechargeable batteries of the IHS according to the selected power throttling factor;

receive, by the embedded controller, a notification that the first software application is no longer in use by the user of the IHS; and based, at least in part, on the received notification that the first software application, that has been designated as the prioritized application, is no longer in use, restrict use, by the embedded controller, of the high-performance battery mode.

18. The non-transitory computer-readable storage device of claim 17, wherein the selected power throttling factor is selected based on an event scheduled by the user.

19. The non-transitory computer-readable storage device of claim 17, wherein the embedded controller is notified the first software application is no longer in use in response to an inability to detect the user in proximity to the IHS.

20. The non-transitory computer-readable storage device of claim 17, wherein the embedded controller is notified the first software application is no longer in use in response to detecting a user interface of the first software application is not visible to the user via a display of the IHS.

* * * * *